(12) United States Patent
Park et al.

(10) Patent No.: US 11,557,571 B2
(45) Date of Patent: Jan. 17, 2023

(54) STACK PACKAGES INCLUDING PASSIVE DEVICES

(71) Applicant: SK hynix Inc., Icheon-si (KR)

(72) Inventors: Se Jin Park, Icheon-si (KR); Jang Hee Lee, Icheon-si (KR)

(73) Assignee: SK hynix Inc., Icheon-si Gyeonggi-do (KR)

(*) Notice: Subject to any disclaimer, the term of this patent is extended or adjusted under 35 U.S.C. 154(b) by 182 days.

(21) Appl. No.: 17/154,797

(22) Filed: Jan. 21, 2021

(65) Prior Publication Data

US 2022/0077114 A1    Mar. 10, 2022

(30) Foreign Application Priority Data

Sep. 8, 2020    (KR) .................. 10-2020-0114965

(51) Int. Cl.
*H01L 25/065*    (2006.01)

(52) U.S. Cl.
CPC .............. *H01L 25/0657* (2013.01); *H01L 2225/06506* (2013.01); *H01L 2225/06562* (2013.01); *H01L 2225/06582* (2013.01)

(58) Field of Classification Search
CPC ....... H01L 25/0657; H01L 2225/06506; H01L 2225/06562; H01L 2225/06582
See application file for complete search history.

(56) References Cited

U.S. PATENT DOCUMENTS

| | | |
|---|---|---|
| 9,496,216 B2 | 11/2016 | Chun et al. |
| 9,673,183 B2 | 6/2017 | Lim |
| 2013/0056882 A1* | 3/2013 | Kim .................... H01L 25/0657 257/E23.141 |
| 2021/0082890 A1* | 3/2021 | Kim ...................... H01L 25/16 |

* cited by examiner

*Primary Examiner* — Timor Karimy
(74) *Attorney, Agent, or Firm* — William Park & Associates Ltd.

(57) ABSTRACT

A stack package includes a package substrate; a lower stack including lower dies stacked on the package substrate to form a zigzag shape in a vertical direction; an upper stack including upper dies that are sequentially offset stacked in an offset direction while providing a first upper side of a down staircase shape, a first end of an uppermost upper die among the upper dies protruding, in a horizontal direction, further than a first lower side of the lower stack; and a first passive device disposed on the package substrate and spaced apart from the first lower side, and disposed between a first portion of the package substrate and the first upper side.

27 Claims, 12 Drawing Sheets

STACK PACKAGES INCLUDING PASSIVE DEVICES

CROSS-REFERENCE TO RELATED APPLICATIONS

The present application claims priority under 35 U.S.C 119(a) to Korean Application No. 10-2020-0114965, filed on Sep. 8, 2020, which is incorporated herein by references in its entirety.

BACKGROUND

1. Technical Field

The present disclosure generally relates to a semiconductor packaging technology and, more particularly, to a stack package device including passive devices.

2. Related Art

Semiconductor packages are used in various electronic applications. The semiconductor packages can be used for personal computers, mobile phones, cameras, and the like. As electronic products and semiconductor packages require high-speed operation and large-capacity data processing, there is an increasing demand for packaging a plurality of semiconductor dies into one semiconductor package. As a plurality of semiconductor dies are embedded in a semiconductor package, a structure in which the semiconductor dies are stacked on each other in three dimensions has been attempted. In order to improve the electrical characteristics of semiconductor packages, attempts have been made to arrange passive devices in a semiconductor package. Attempts are being made to add a larger number of passive devices within a limited size of a semiconductor package.

SUMMARY

A stack package according to an aspect of the present disclosure may include: a package substrate; a lower stack including lower dies stacked on the package substrate to form a zigzag shape in a vertical direction; an upper stack including upper dies that are sequentially offset stacked in an offset direction while providing a first upper side of a down staircase shape, a first end of an uppermost upper die among the upper dies protruding, in a horizontal direction, further than a first lower side of the lower stack; and a first passive device disposed on the package substrate and spaced apart from the first lower side, and disposed between a first portion of the package substrate and the first upper side.

A stack package according to an aspect of the present disclosure may include: a package substrate; first and second passive devices disposed on the package substrate to be spaced apart from each other; a lower stack disposed between the first and second passive devices and including lower dies that are vertically stacked and provide first and second lower sides; and an upper stack including a lowermost upper die having a second end partially overlapping the second passive device, an intermediate upper die, and an uppermost upper die having a first end partially overlapping the first passive device, the lowermost upper die, the intermediate upper die, and the uppermost upper die being sequentially stacked in a staircase shape.

DETAILED DESCRIPTION

Figure 1:
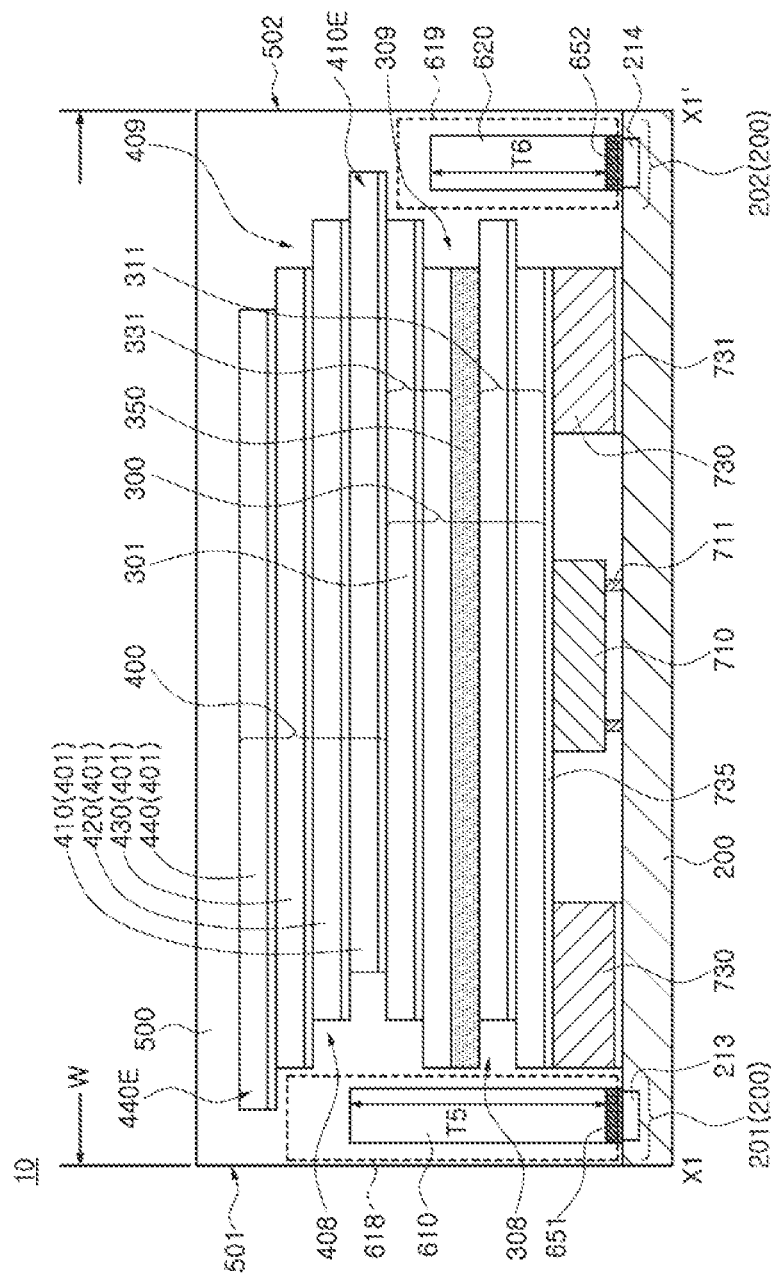
FIGS. 1 and 2 are schematic cross-sectional views illustrating a stack package according to an embodiment.

The terms used herein may correspond to words selected in consideration of their functions in presented embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first," "second," "third," etc. may be used herein to describe various devices, these devices should not be limited by these terms. These terms are only used to distinguish one device from another device, but not used to indicate a particular sequence or number of devices.

The semiconductor device may include a semiconductor substrate or a structure in which a plurality of semiconductor substrates are stacked. The semiconductor device may indicate a semiconductor package structure in which a structure in which semiconductor substrates are stacked is packaged. The semiconductor substrate may indicate a semiconductor wafer, a semiconductor die, or a semiconductor chip in which electronic components and devices are integrated. The semiconductor chip may indicate memory chips in which memory integrated circuits such as dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits, or phase change random access memory (PcRAM) are integrated, logic dies or ASIC chips in which logic circuits are integrated in a semiconductor substrate, or processor such as application processors (Aps), graphic processing units (GPUs), central processing units (CPUs) or system-on-chips (SoCs). The semiconductor devices may be employed in information communication systems such as mobile phones, electronic systems associated with biotechnology or health care, or wearable electronic systems. The semiconductor packages may be applicable to internet of things (IoT).

Same reference numerals refer to same devices throughout the specification. Even though a reference numeral might not be mentioned or described with reference to a drawing, the reference numeral may be mentioned or described with reference to another drawing. In addition, even though a reference numeral might not be shown in a drawing, it may be shown in another drawing.

Figure 2:
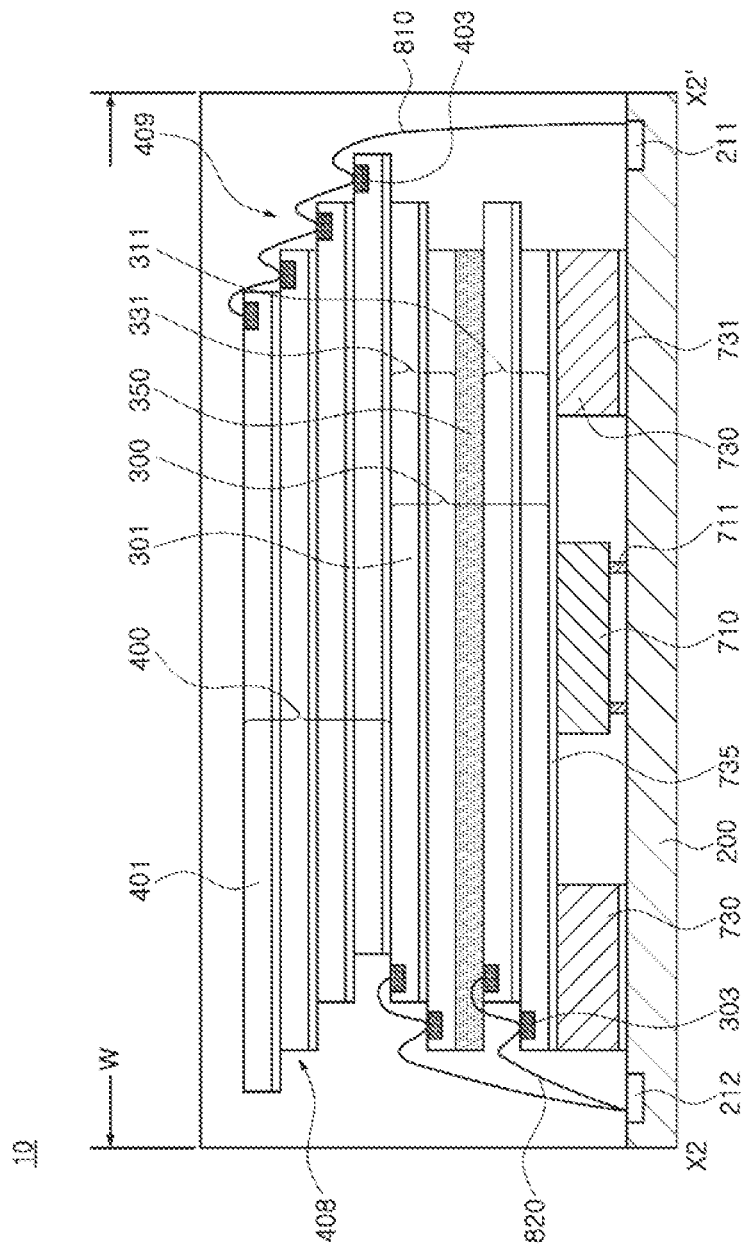

FIGS. 1 and 2 are schematic cross-sectional views illustrating a stack package 10 according to an embodiment. FIG. 1 illustrates a schematic cross-sectional shape along a cutting line X1-X1' passing through first and second passive devices 610 and 620 of the stack package 10. FIG. 2 illustrates a schematic cross-sectional shape along a cutting line X2-X2' passing through first and second bonding wires 810 and 820 of the stack package 10.

Referring to FIG. 1, the stack package 10 may include a package substrate 200, a lower stack 300, an upper stack 400, an encapsulation layer 500, and the first passive device 610. Referring to FIG. 2, the stack package 10 may further include connecting members such as the first bonding wires 810 and the second bonding wires 820. The stack package 10 may further include a controller die 710 disposed between the lower stack 300 and the package substrate 200. The encapsulation layer 500 may be formed as a protection layer covering and encapsulating the lower stack 300 and the upper stack 400 while covering the package substrate 200. The encapsulation layer 500 may be formed of an epoxy molding compound (EMC).

The lower stack 300 may include lower dies 301, and the upper stack 400 may include upper dies 401. The controller die 710 may be an integrated semiconductor die in which logic circuitry controlling the lower dies 301 and the upper dies 401 is integrated. In order to secure a space in which the controller die 710 is to be disposed, supporters 730 may be introduced. The supporters 730 may be disposed around the controller die 710 to support the lower stack 300 while lifting the lower stack 300. The supporters 730 may be introduced in the form of dummy dies or dielectric blocks.

The supporters 730 may be bonded to the package substrate 200 by a third adhesive layer 731. The controller die 710 may be connected to the package substrate 200 by conductive inner connectors 711. The conductive inner connector 711 may include a conductive member such as a bump. The lower stack 300 may be bonded to the controller die 710 and the supporters 730 by a fourth adhesive layer 735.

The stack package 10 may further include a second passive device 620. The second passive device 620 may be a device of a different type from the first passive device 610. Each of the passive devices 610 and 620 may include a capacitor, a register, or an inductor. The passive devices 610 and 620 may be introduced in the stack package 10 as devices that provide functions such as decoupling, filtering, resonance attenuation, or voltage regulation. The first passive device 610 may include a capacitor, and the second passive device 620 may include a resistor. The passive devices 610 and 620 can contribute to improving electrical characteristics and reliability of signal characteristics of the stack package 10.

The lower stack 300 may have a structure in which a plurality of lower dies 301 are stacked substantially perpendicular to each other. The upper stack 400 may have a structure in which a plurality of upper dies 401 are stacked substantially perpendicular to each other. The number of the stacked lower dies 301 may be the same as the number of the stacked upper dies 401. In an embodiment, the number of the stacked lower dies 301 may be different from the number of the stacked upper dies 401. The structure in which the lower dies 301 are stacked may be different from the structure in which the upper dies 401 are stacked.

The lower dies 301 and the upper dies 401 may be semiconductor dies having the same shape and function as each other. The lower dies 301 and the upper dies 401 may be memory semiconductor dies. In an embodiment, the lower dies 301 and the upper dies 401 may be different types of semiconductor dies.

The lower stack 300 may include a first sub stack 311 and a second sub stack 331. The second sub stack 331 may be vertically stacked on the first sub stack 311. A first adhesive layer 350 may be introduced into an interface between the second sub stack 331 and the first sub stack 311 while bonding the second sub stack 331 to the first sub stack 311. The first and second sub stacks 311 and 331 may have substantially the same shape. The first and second sub stacks 311 and 331 may be stacked to be aligned with each other in a vertical direction. The second sub stack 331 may be stacked to be fully overlapped with the first sub stack 311. Additional sub stacks may be further stacked on the first and second sub stacks 311 and 331.

Figure 3:
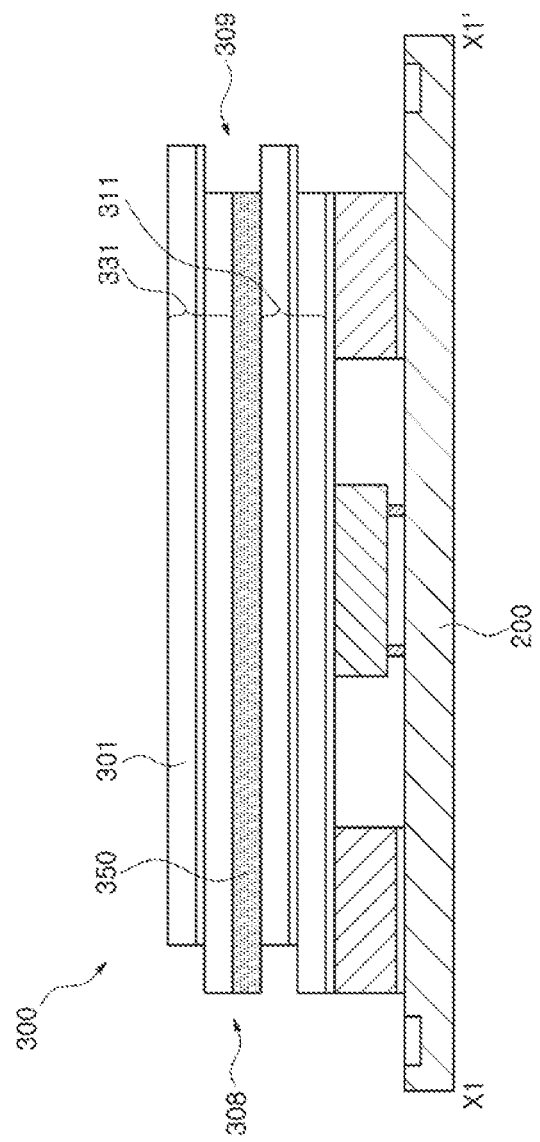
FIG. 3 is a schematic cross-sectional view illustrating a shape of a lower stack of the stack package of FIG. 1.

FIG. 3 is a schematic cross-sectional view illustrating a shape of a lower stack 300 of FIG. 1.

Referring to FIG. 3, a plurality of lower dies 301 may be substantially vertically stacked on each other to configure the lower stack 300. The lower dies 301 may be stacked on each other while forming a zigzag shape in the vertical direction. The lower dies 301 may be stacked to be alternately stacked in the vertical direction. The lower stack 300 provides a first lower side 308 and a second lower side 309 that are opposite to each other. The first lower side 308 and the second lower side 309 may be formed as concavo-convex sides or jagged sides or staggered sides.

Figure 4:
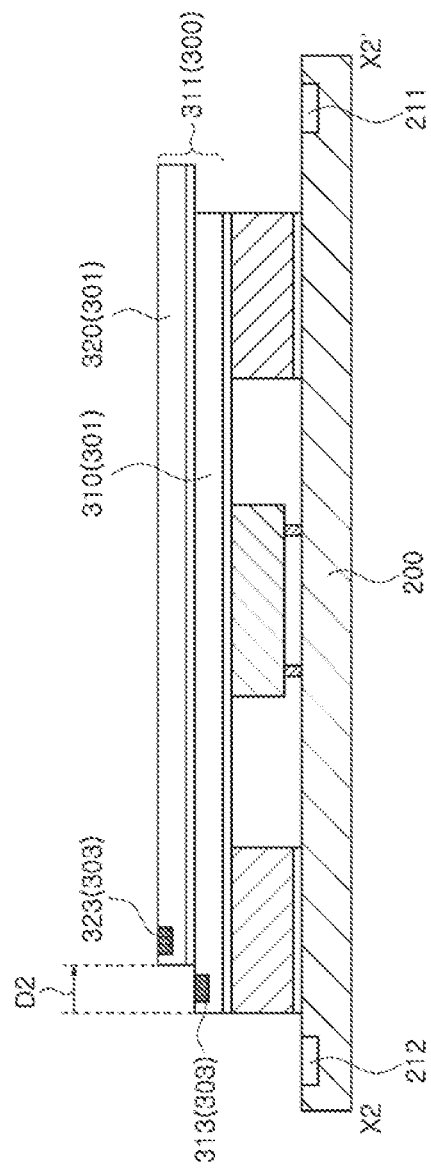
FIG. 4 is a schematic cross-sectional view illustrating a shape of a first sub stack of the stack package of FIG. 2.

FIG. 4 is a schematic cross-sectional view illustrating a shape of a first sub stack 311 of FIG. 2.

Referring to FIG. 4 and FIG. 2, the first sub stack 311 constituting the lower stack 300 may include a first lower die 310 and a second lower die 320. In an embodiment, additional lower dies may be further disposed on the second lower die 320. Each of the lower dies 301 may include a lower bonding pad 303 at an edge portion. The lower bonding pads 303 may be connection members to which the second bonding wires 820 of FIG. 2 are bonded.

The second lower die 320 may be disposed at a position moved by a predetermined distance in the second offset direction D2 compared to the first lower die 310. In an embodiment, the second lower die 320 may be disposed at a position moved in a horizontal direction by a predetermined distance in the second offset direction D2 compared to the first lower die 310. The second lower die 320 may be offset stacked on the first lower die 310. The second lower die 320 may be offset stacked on the first lower die 310 while exposing a first lower bonding pad 313 of the first lower die 310.

Figure 5:
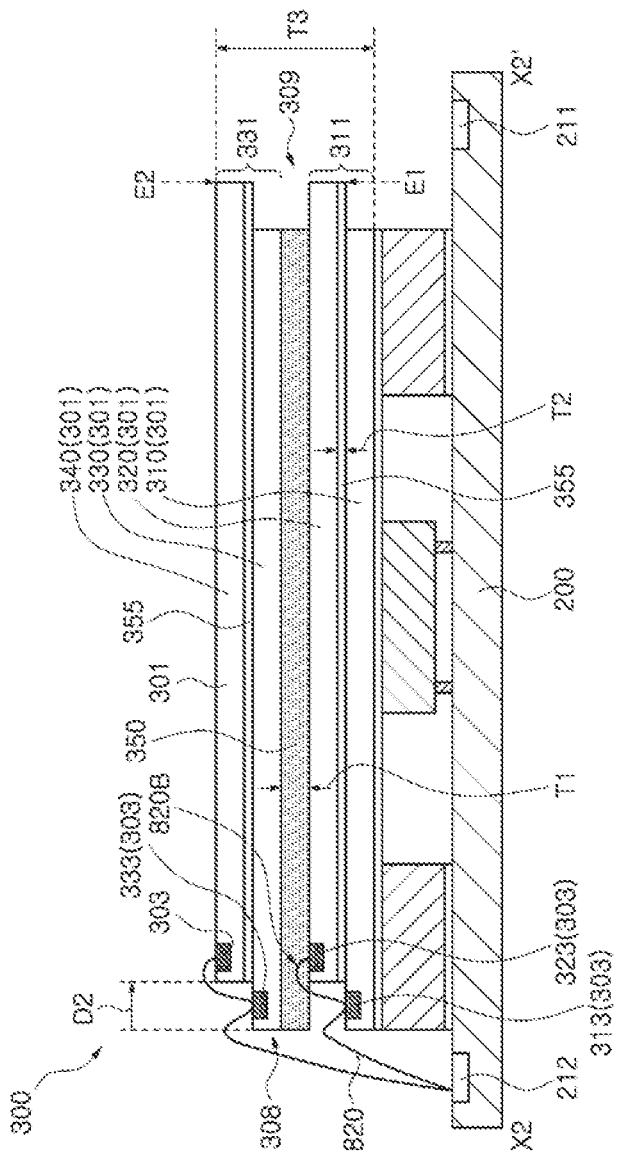
FIG. 5 is a schematic cross-sectional view illustrating a shape of a lower stack of the stack package of FIG. 2.

FIG. 5 is a schematic cross-sectional view illustrating a shape of the lower stack 300 of FIG. 2.

Referring to FIG. 5, the second sub stack 331 may be stacked on the first sub stack 311. The second sub stack 331 may be stacked while being substantially fully aligned with the first sub stack 311 in the vertical direction. A second edge E2 of the second sub stack 331 may be aligned with a first edge E1 of the first sub stack 311 in the vertical direction. The second sub stack 331 may have the same shape as the first sub stack 311. A third lower die 330 may be disposed on the first sub stack 311 to overlap the first lower die 310 substantially fully. A fourth lower die 340 may be disposed to overlap the second lower die 320 substantially fully. The fourth lower die 340 may be offset stacked on the third lower die 330 at a position offset from the third lower die 330 in the second offset direction D2.

The structure of the lower stack 300 in which the second sub stack 331 is superimposed on the first sub stack 311 may include a structure in which the lower dies 301 are stacked alternately while forming a zigzag shape in a substantially vertical direction. This zigzag stack structure is useful for connecting the second bonding wires 820 to each of the lower dies 301.

The second bonding wires 820 may be formed to electrically connect the lower bonding pads 303 of the lower dies 301 to the package substrate 200. The package substrate 200 may include first bonding fingers 211 and second bonding fingers 212. The second bonding wires 820 may electrically connect the lower bonding pads 303 to the second bonding fingers 212. The second bonding wires 820 may be extended to connect the second lower bonding pad 323 to the first lower bonding pad 313 and further connect to the second bonding finger 212.

In the zigzag stack structure of the lower stack 300, the second lower die 320 is stacked on the first lower die 310. The second lower die 320 is offset stacked in the second offset direction D2 to expose the first lower bonding pads 313 of the first lower die 310. The first lower bonding pads 313 are exposed without being covered by the second lower die 320, so that the second lower die 320 might not interfere with bonding of the second bonding wire 820 to the first lower bonding pad 313.

The third lower die 330 of the second sub stack 331 may be substantially fully overlapped with the first lower die 310. The third lower die 330 may be positioned so that a portion of the third lower die 330 overlaps a portion 820B of the second bonding wire 820 bonded to the second lower bonding pad 323. Accordingly, the portion 820B of the second bonding wire 820 bonded to the second lower bonding pad 323 may be deformed or damaged by being pressed by the third lower die 330. In order to prevent such damage, a first adhesive layer 350 is introduced between the second lower die 320 and the third lower die 330. The first adhesive layer 350 secures a gap between the second lower die 320 and the third lower die 330, so that the portion 820B of the second bonding wire 820 can be prevented from being damaged by the third lower die 330. To this end, the first adhesive layer 350 may be formed to have a thickness T1 that is thicker than a loop height formed by the portion 820B of the second bonding wire 820 bonded to the second lower bonding pad 323.

The first adhesive layer 350 may be formed to be thicker than second adhesive layers 355 used to bond the other lower dies 301 except for the second lower die 320. The first adhesive layer 350 may be formed to have the thickness T1 that is thicker than the thickness T2 of the second adhesive layer 355. The second adhesive layer 355 may be introduced as a layer bonding the first lower die 310 and the second lower die 320 to each other. There may be no need to secure a gap for the second bonding wire 820 between the first lower die 310 and the second lower die 320. Therefore, the second adhesive layer 355 may be introduced with a thickness T2 that is thinner than the first adhesive layer 350.

The second lower die 320 is offset stacked on the first lower die 310 to expose the first lower bonding pad 313, so that the relatively thin second adhesive layer 355 can be introduced between the second lower die 320 and the first lower die 310 without introducing a relatively thick adhesive layer such as the first adhesive layer 350. The fourth lower die 340 is also offset stacked on the third lower die 330 to expose the third lower bonding pad 333, so that the relatively thin second adhesive layer 355 can be introduced between the fourth lower die 340 and the third lower die 330 without introducing a relatively thick adhesive layer such as the first adhesive layer 350. As described above, because the thick first adhesive layer 350 can be limitedly introduced only between the first sub stack 311 and the second sub stack 331, it is possible to prevent excessive increase in the thickness T3 of the lower stack 300.

The portion 820B of the second bonding wire 820 is bonded to the second lower bonding pad 323 while penetrating into the first adhesive layer 350. The portion 820B of the second bonding wire 820 may be impregnated into the first adhesive layer 350.

Figure 6:
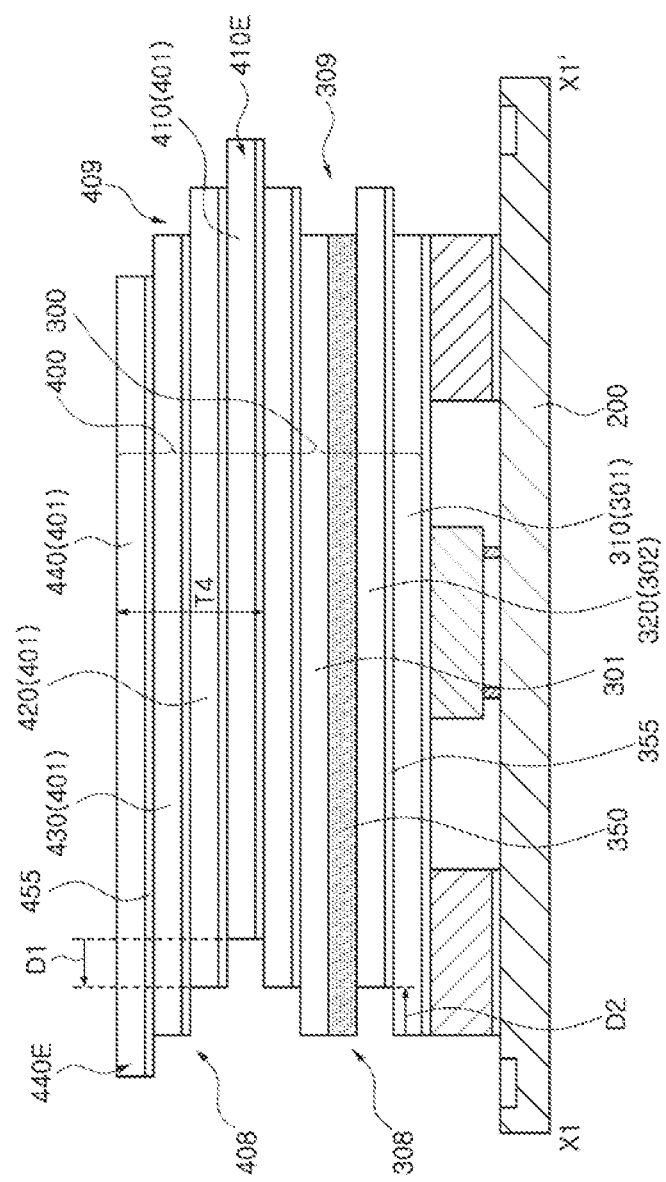
FIG. 6 is a schematic cross-sectional view illustrating a shape in which lower and upper stacks of the stack package of FIG. 1 are stacked.

FIG. 6 is a schematic cross-sectional view illustrating a shape in which the lower and upper stacks 300 and 400 of the stack package 10 of FIG. 1 are stacked. FIG. 6 is a view illustrating a shape in which the first and second passive devices (610 and 620 of FIG. 1) of FIG. 1 have been omitted.

Referring to FIG. 6, the upper stack 400 is disposed on the lower stack 300. A plurality of upper dies 401 may be sequentially moved in the first offset direction D1 and offset stacked. The first offset direction D1 may be a direction opposite to the second offset direction D2 in which the lower dies 301 are offset. In an embodiment, the first offset direction D1 may be a horizontal direction opposite to the second offset direction D2 in which the lower dies 301 are offset. A distance at which each of the upper dies 401 is offset and moved in the first offset direction D1 may be substantially the same as a distance at which each of the lower dies 301 is moved in the second offset direction D2. The distance at which each of the upper dies 401 is offset in the first offset direction D1 may be substantially the same as the distance at which each of the second lower die 320 is offset with respect to the first lower die 310 in the second offset direction D2.

As the upper dies 401 are sequentially stacked in the first offset direction D1, the upper stack 400 having a staircase shape may be formed. The upper stack 400 may have a first upper side 408 of a down staircase shape that descends toward the package substrate 200. The upper stack 400 may have a second upper side 409 having an up staircase shape on the opposite side of the first upper side 408. The second upper side 409 may have an opposite shape or a reverse shape to the first upper side 408.

A first end 440E of an uppermost upper die 440 among the upper dies 401 may protrude outside the first lower side 308 of the lower stack 300. In an embodiment, the first end 440E of an uppermost upper die 440 among the upper dies 401 may protrude, in a horizontal direction, further than the first lower side 308 of the lower stack 300. A second end 410E of a lowermost upper die 410 among the upper dies 401 may further protrude outside the second lower side 309 of the lower stack 300. A first intermediate upper die 420 and a second intermediate upper die 430 may be stacked between the lowermost upper die 410 and the uppermost upper die 440. In an embodiment, three or more upper dies may be stacked between the lowermost upper die 410 and the uppermost upper die 440.

Referring to FIG. 6 together with FIG. 2, the upper stack 400 has the first upper side 408 and the second upper side 409. The second upper side 409 may have an up staircase shape, and the up staircase shape may expose upper bonding pads 403 of each of the upper dies 401. First bonding wires 810 may be formed to electrically connect the upper bonding pads 403 to the first bonding fingers 211 of the package substrate 200. Each of the first bonding wires 810 may connect the exposed upper bonding pads 403 to each other through the staircase structure.

Fifth adhesive layers 455 may be introduced between the upper dies 401 to bond the upper dies 401 to each other. The fifth adhesive layers 455 may be introduced as adhesive layers having substantially the same thickness as the second adhesive layer 355. The upper dies 401 of the upper stack 400 are stacked in a sequential staircase shape to expose the upper bonding pads 403 as illustrated in FIG. 2, so that a relatively thick adhesive layer such as the first adhesive layer 350 might not be introduced. The thickness T4 of the upper stack 400 can be minimized because each of the upper dies 401 is bonded with the relatively thin fifth adhesive layers 455.

Figure 7:
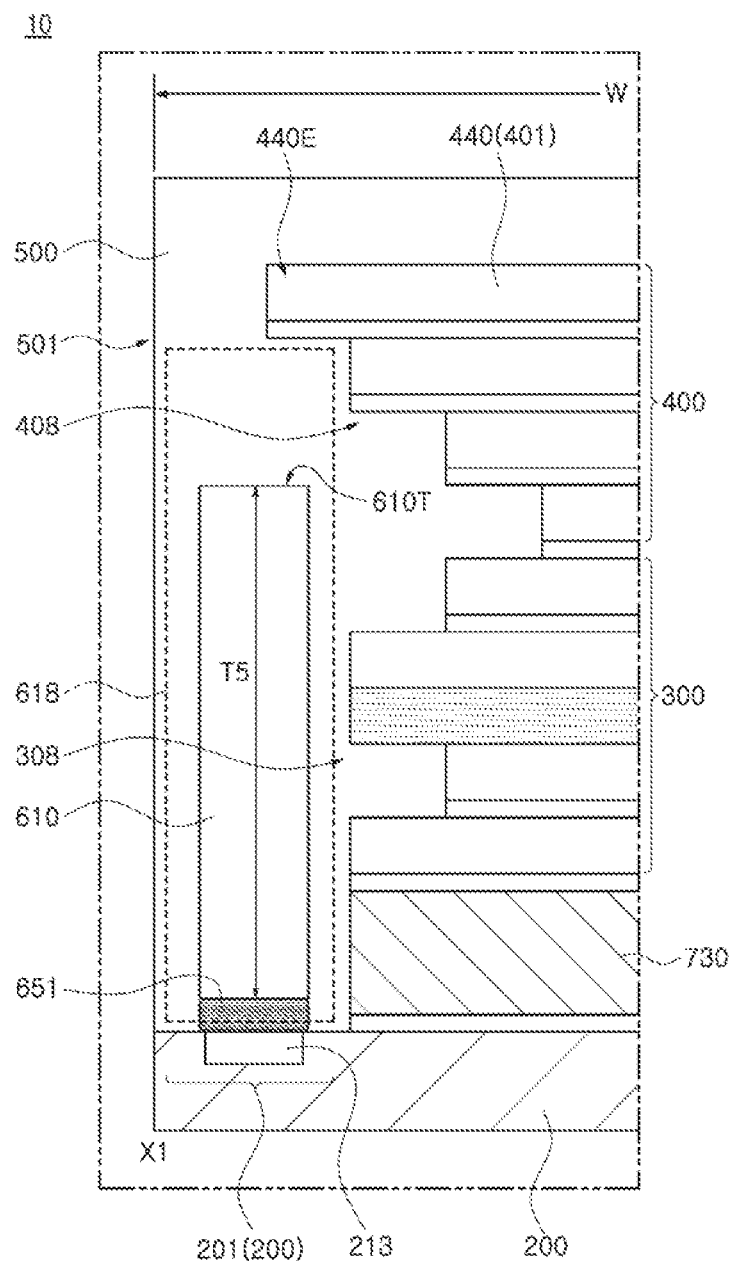
FIG. 7 is a schematic cross-sectional view illustrating an enlarged portion including a first passive device of the stack package of FIG. 1.

FIG. 7 is a schematic cross-sectional view illustrating an enlarged portion including the first passive device 610 of the stack package 10 of FIG. 1.

Referring to FIG. 7, the first passive device 610 may be disposed on a first portion 201 of the package substrate 200. The first portion 201 of the package substrate 200 may refer to one of the edge portions of the package substrate 200 facing each other. A third bonding finger 213 to which the first passive device 610 is connected may be disposed on the first portion 201 of the package substrate 200. The first passive device 610 may be bonded to the third bonding finger 213 by a first conductive adhesive layer 651. The first conductive adhesive layer 651 may include a solder material. The first passive device 610 may be electrically connected to the package substrate 200 through the first conductive adhesive layer 651.

An encapsulation layer 500 may have a first outer side 501. The first outer side 501 may be a side facing the first lower side 308 of the lower stack 300 and the first upper side 408 of the upper stack 400. A first space 618 may be secured between the outer side 501 of the encapsulation layer 500 and the first lower side 308 of the lower stack 300, the first upper side 408 of the upper stack 400, and the first portion 201 of the package substrate 200. The first passive device 610 may be disposed in the first space 618. In an embodiment, the first passive device 610 may be disposed in the first space 618 and spaced apart, in a horizontal direction, from the first lower side 308 of the lower stack 300.

The first passive device 610 may be disposed in the first portion 201 of the package substrate 200 so that an upper end 610T of the first passive device 610 is lower than the first end 440E of the uppermost upper die 440. The first passive device 610 may be disposed in the first portion 201 of the package substrate 200 so that some portions of the first passive device 610 overlap the first end 440E of the uppermost upper die 440. Accordingly, the first passive device 610 can be disposed on the package substrate 200 while suppressing an increase in the width W or size of the stack package 10. If the first passive device does not overlap the first end 440E of the uppermost upper die 440 and is located outside the first end 440E of the uppermost upper die 440, the width of the stack package may be increased in order to further secure an area or space in which the first passive device is to be disposed. However, because the first passive device 610 is disposed in the stack package 10 so that some portions of the first passive device 610 overlap the first end 440E of the uppermost upper die 440, the increase in the width W of the stack package 10 can be substantially minimized. The overlap space under the first end 440E of the uppermost upper die 440 can be used as a space in which the first passive device 610 is disposed, so that the increase in the width W of the stack package 10 can be substantially minimized.

The upper end 610T of the first passive device 610 may be spaced apart from the first end 440E of the uppermost upper die 440 without contacting. The first end 440E of the uppermost upper die 440 can be located at a higher position than the first passive device 610, so that the first end 440E of the uppermost upper die 440 can be spaced apart from the upper end 610T of the first passive device 610. Accordingly, it is possible to prevent the upper end 610T of the first passive device 610 from contacting the first end 440E of the uppermost upper die 440. In addition, it is possible to effectively prevent the defect in which the upper end 610T of the first passive device 610 contacts the first end 440E of the uppermost upper die 440 and is damaged.

Figure 8:
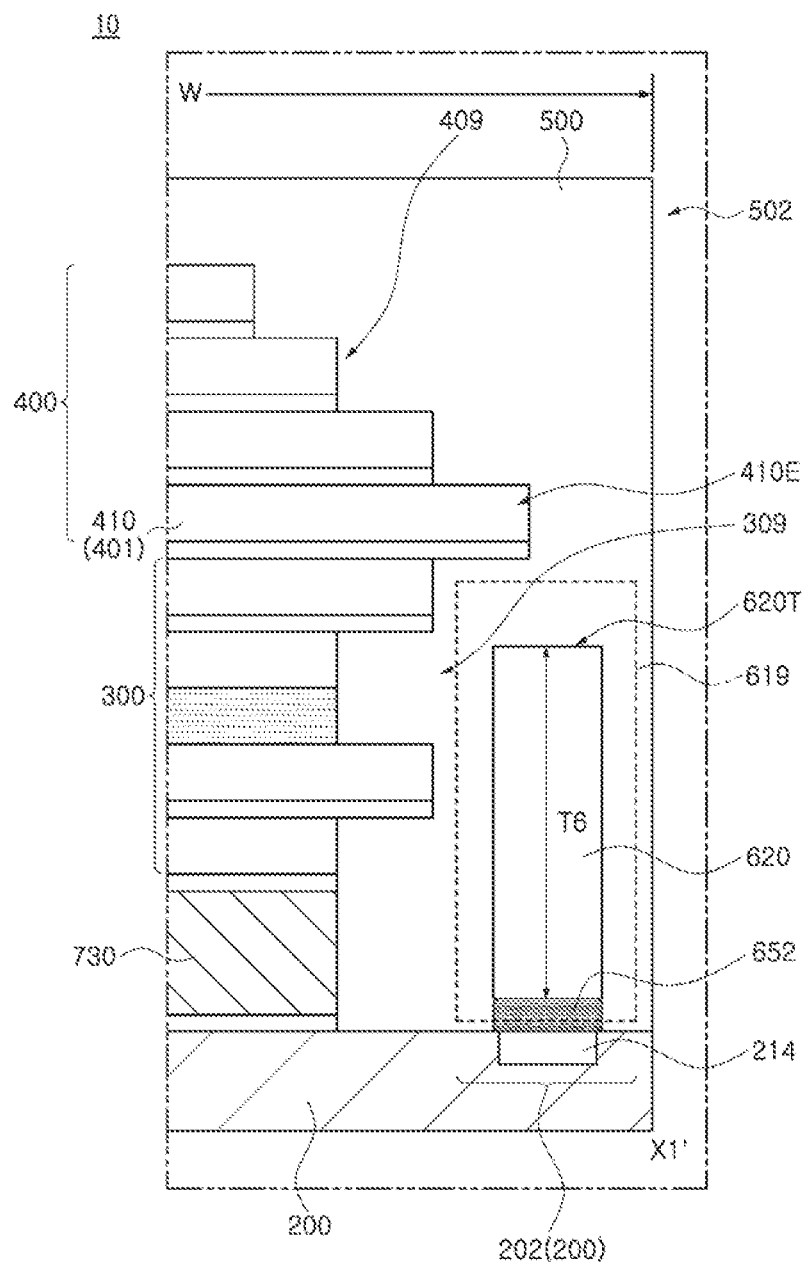
FIG. 8 is a schematic cross-sectional view illustrating an enlarged portion including a second passive device of the stack package of FIG. 1.

FIG. 8 is a schematic cross-sectional view illustrating an enlarged portion including the second passive device 620 of the stack package 10 of FIG. 1.

Referring to FIG. 8, the second passive device 620 may be disposed on a second portion 202 of the package substrate 200. A fourth bonding finger 214 to which the second passive device 620 is connected may be disposed on the second portion 202 of the package substrate 200. The second passive device 620 may be bonded to the fourth bonding finger 214 by a second conductive adhesive layer 652. The second passive device 620 may be electrically connected to the package substrate 200 through the second conductive adhesive layer 652.

A second outer side 502 of the encapsulation layer 500 may be a side facing the second lower side 309 of the lower stack 300 and the second upper side 409 of the upper stack 400. The second outer side 502 of the encapsulation layer 500 is a side opposite to the first outer side (501 in FIG. 7). A second space 619 can be secured between the second outer side 502 of the encapsulation layer 500 and the second lower side 309 of the lower stack 300, the second upper side 409 of the upper stack 400, and the second portion 202 of the package substrate 200. The second passive device 620 can be disposed in the second space 619. In an embodiment, the second passive device 620 can be disposed in the second space 619 and spaced apart, in a horizontal direction, from the second lower side 309 of the lower stack 300.

The second passive device 620 may be disposed on the second portion 202 of the package substrate 200 such that an upper end 620T is lower than the second end 410E of the lowermost upper die 410. The second passive device 620 may be disposed on the second portion 201 of the package substrate 200 so that a portion of the second passive device 620 overlaps the second end 410E of the lowermost upper die 410, and the upper end 620T of the second passive device 620 may be spaced apart from the second end 410E of the lowermost upper die 410 without contacting. The second end 410E of the lowermost upper die 410 may be positioned at a higher position than the second passive device 620. Accordingly, it is possible to effectively prevent the upper end 620T of the second passive device 620 from contacting the second end 410E of the lowermost upper die 410 and damage defects due to the contact.

The second passive device 620 is disposed in the stack package 10 so that a portion of the second passive device 620 overlaps the second end 410E of the lowermost upper die 410. Accordingly, it is possible to effectively suppress or substantially minimize an increase in the width W or size of the stack package 10 due to the arrangement of the second passive device 620. If the second passive device does not overlap the second end 410E of the lowermost upper die 410 and is located outside the second end 410E of the lowermost upper die 410, the width of the stack package may be increased to further secure an area or space in which the second passive device is disposed. However, because the first passive device 610 is disposed inside the stack package 10 so that a portion of the first passive device 610 overlaps the first end 440E of the uppermost upper die 440, the increase in the width W or size of the stack package 10 can be substantially minimized. The overlap space under the second end 410E of the lowermost upper die 410 can be used as a space in which the second passive device 620 is disposed, so that the increase in the width W of the stack package 10 can be substantially minimized.

Referring to FIGS. 8 and 7 together, because the position of the second end 410E of the lowermost upper die 410 is lower than the position of the first end 440E of the uppermost upper die 440, the height of the second space 619 is lower than the height of the first space 618. In order for the second passive device 620 to be disposed in the second space 619, it is appropriate for the second passive device 620 to have a thickness T6 that is less than the thickness T5 of the first passive device 610. In an embodiment, a capacitor device may be introduced as the first passive device 610, and a resistor device may be introduced as the second passive device 620.

Figure 9:
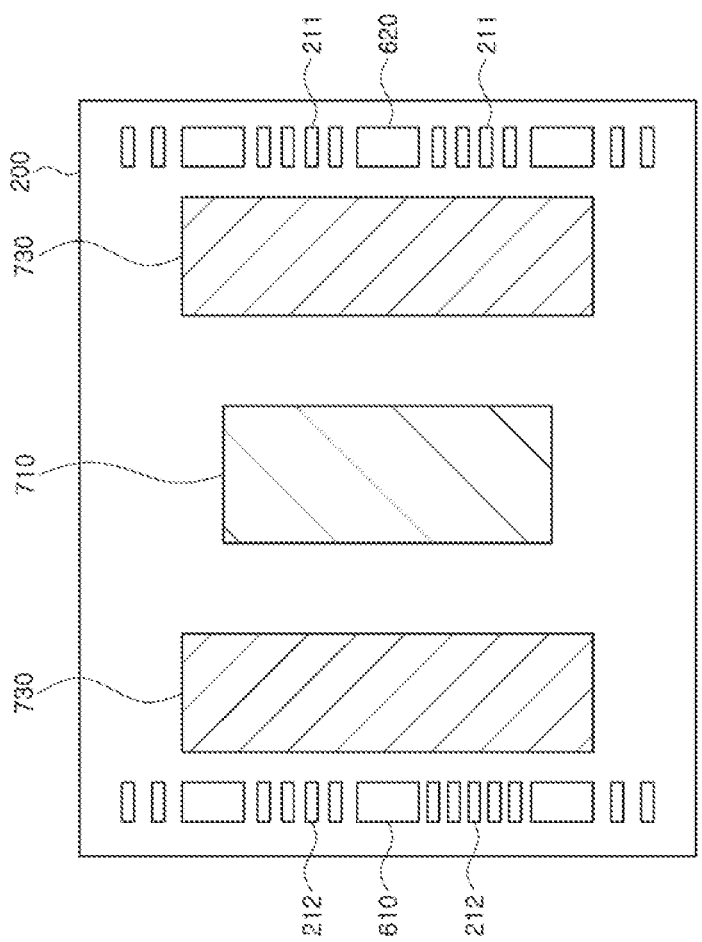
FIG. 9 is a schematic plan view illustrating an arrangement shape of the first and second passive devices of the stack package of FIG. 1.

FIG. 9 is a schematic plan view illustrating a planar shape in which the first and second passive devices 610 and 620 of FIG. 1 are disposed on the package substrate 200.

Referring to FIGS. 9 and 1, first bonding fingers 211 may be arranged in a column on one side of the package substrate 200, and second bonding fingers 212 may be arranged in a column on the opposite side. The second passive devices 620 may be disposed between the first bonding fingers 211, and the first passive devices 610 may be disposed between the second bonding fingers 212. Because the passive devices 610 and 620 are disposed between the columns formed by the bonding fingers 211 and 212, the area in which the passive devices 610 and 620 are disposed on the package substrate 200 can be effectively secured. Accordingly, the number of the passive devices 610 and 620 that may be disposed in the stack package 10 can be increased. Accordingly, electrical characteristics of the stack package 10 can be improved.

Meanwhile, a controller die 710 may be disposed at a central portion of the package substrate 200, and supporters 730 may be disposed on both sides of the controller die 710. Accordingly, the lower stack 300 is supported in a balanced manner by the supporters 730 on both sides, so that the lower stack 300 and the upper stack 400 can be stably supported by the supporters 730.

Figure 10:
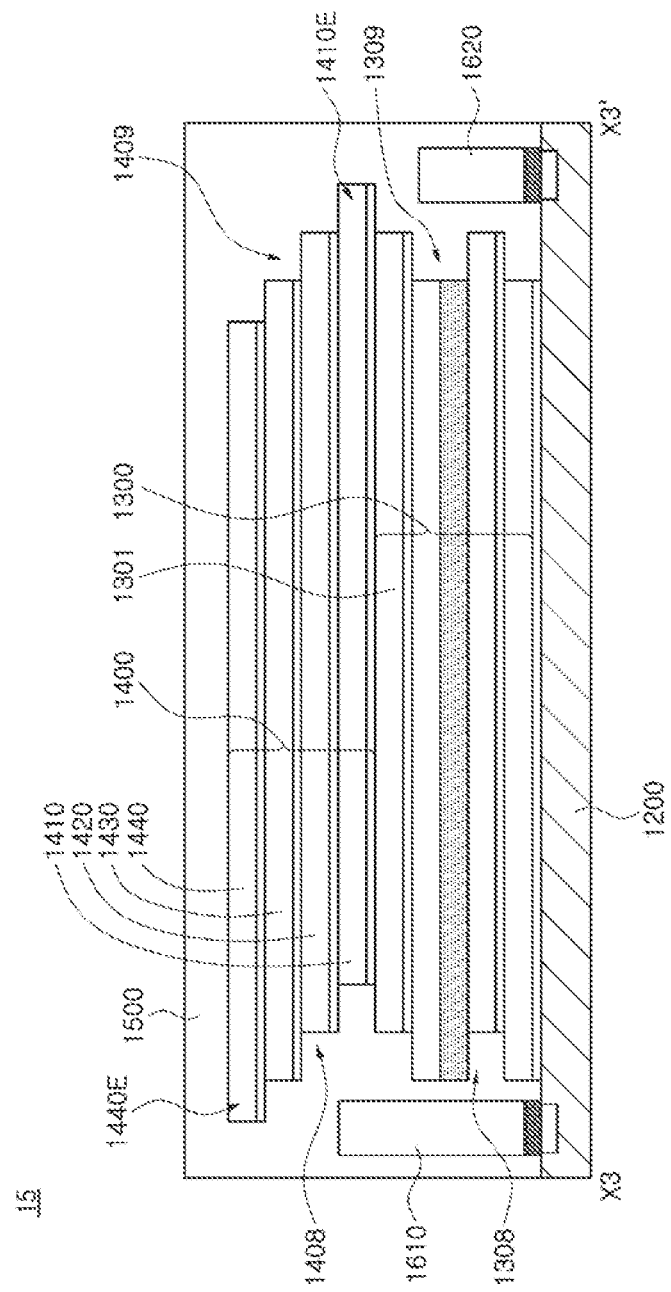
FIGS. 10 and 11 are schematic cross-sectional views illustrating a stack package according to an embodiment.
Figure 11:
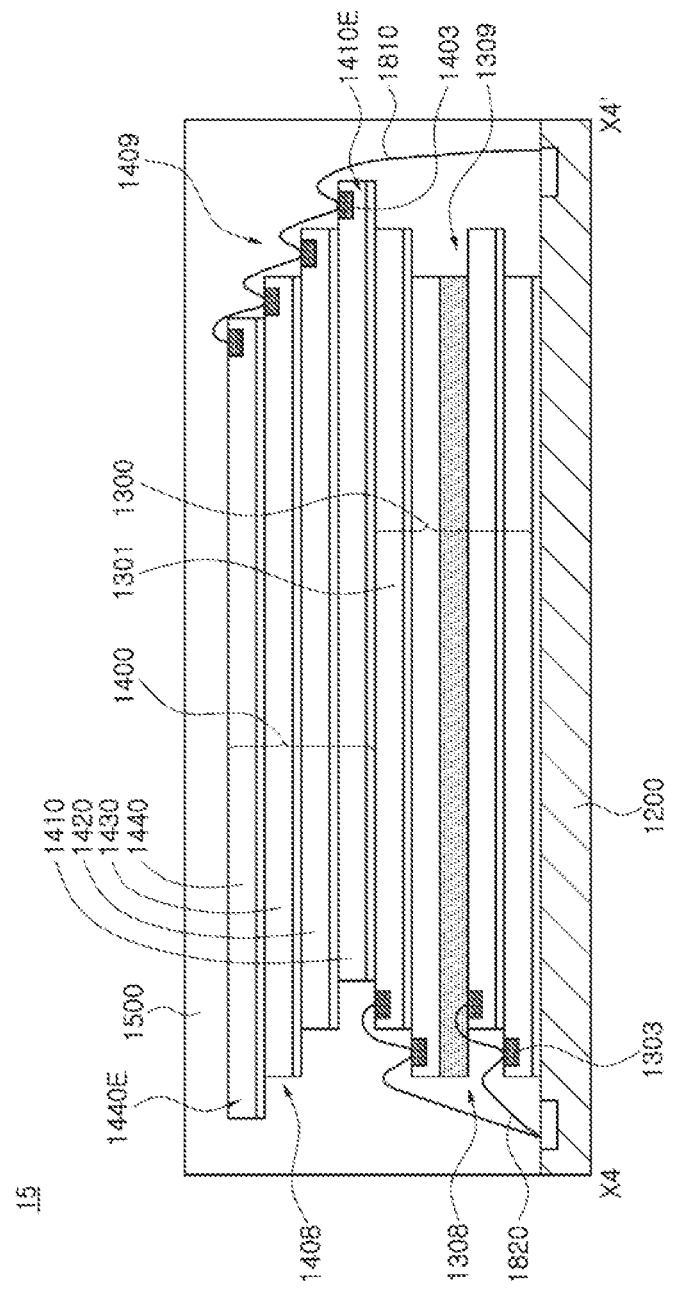

FIGS. 10 and 11 are schematic cross-sectional views illustrating a stack package 15 according to an embodiment. FIG. illustrates a schematic cross-sectional shape along a cutting line X3-X3' passing through first and second passive devices 1610 and 1620 of the stack package 15. FIG. 11 illustrates a schematic cross-sectional shape along a cutting line X4-X4' passing through first and second bonding wires 1810 and 1820 of the stack package 15.

The stack package 15 of the embodiment presented in FIGS. and 11 may have a package structure in which a controller die 710 and supporters 730 are not introduced, unlike the stack package of another embodiment illustrated in FIGS. 1 and 2. Elements illustrated in FIGS. 10 and 11 identical to or similar to those in FIGS. 1 and 2 may be understood as substantially the same elements.

Referring to FIGS. 10 and 11, the stack package 15 may include a package substrate 1200, an encapsulation layer 1500, the first and second passive devices 1610 and 1620, a lower stack 1300, and an upper stack 1400. The first and second passive devices 1610 and 1620 may be disposed on the package substrate 1200 while being spaced apart from each other. The lower stack 1300 may be disposed between the first and second passive devices 1610 and 1620, and may be stacked in a vertical direction so that lower dies 1301 provide first and second lower sides 1308 and 1309. Second bonding wires 1820 may be connected to lower bonding pads 1303 exposed to the first lower side 1308 of the lower stack 1300.

A lowermost upper die 1410, intermediate upper dies 1420 and 1430, and an uppermost upper die 1440 may be sequentially stacked in a staircase shape to configure the upper stack 1400. The upper stack 1400 may have a first upper side 1408 having a down staircase shape and a second upper side 1409 having an up staircase shape. A second end 1410E of the lowermost upper die 1410 may partially overlap the second passive device 1620, and the first end 1440E of the uppermost upper die 1440 may partially overlap the first passive device 1610. First bonding wires 1810 may be connected to upper bonding pads 1403 exposed to the second upper side 1409 of the upper stack 1400.

According to the above-described embodiments of the present disclosure, a stack package structure including passive devices can be provided. A stack structure of semiconductor dies securing spaces in which passive devices are disposed in a stack package can be provided. The stack package can contain multiple passive devices while maintaining a limited size and thickness.

Figure 12:
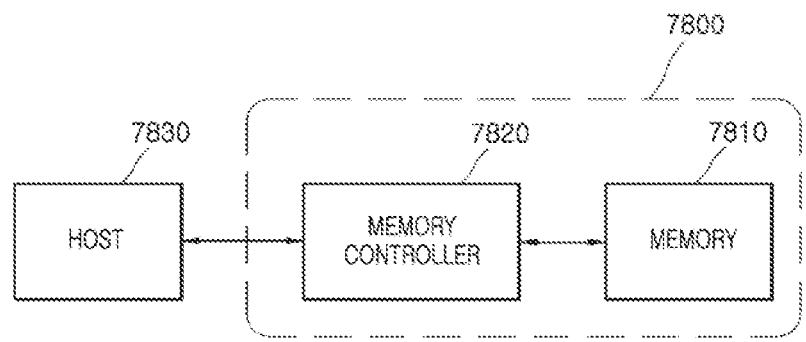
FIG. 12 is a block diagram illustrating an electronic system employing a memory card including a package in accordance with an embodiment.

FIG. 12 is a block diagram illustrating an electronic system including a memory card 7800 employing at least one of the semiconductor packages according to the embodiments. The memory card 7800 includes a memory 7810 such as a nonvolatile memory device, and a memory controller 7820. The memory 7810 and the memory controller 7820 may store data or read out the stored data. At least one of the memory 7810 and the memory controller 7820 may include at least one of the semiconductor packages according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 13:
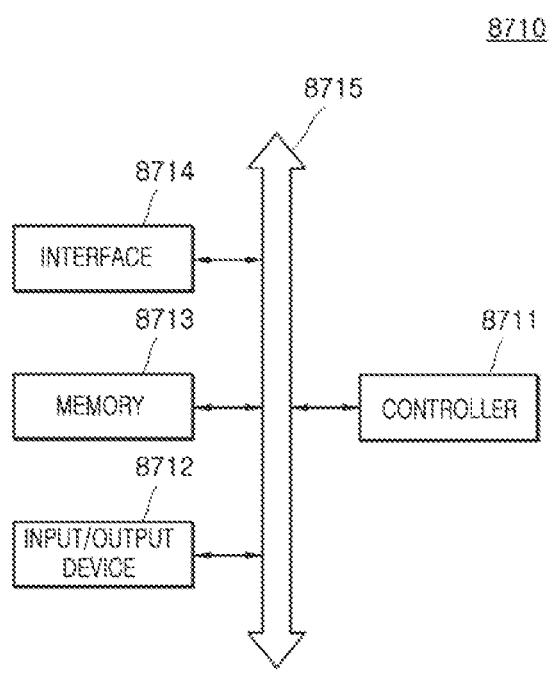
FIG. 13 is a block diagram illustrating an electronic system including a package according to an embodiment.

FIG. 13 is a block diagram illustrating an electronic system 8710 including at least one of the semiconductor packages according to the embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include at least one of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution) or Wibro (wireless broadband Internet).

The concepts have been disclosed in conjunction with some embodiments as described above. Those skilled in the art will appreciate that various modifications, additions and substitutions are possible, without departing from the scope and spirit of the present disclosure. Accordingly, the embodiments disclosed in the present specification should be considered from not a restrictive standpoint but an illustrative standpoint. The scope of the concepts are not limited to the above descriptions but defined by the accompanying claims, and all of distinctive features in the equivalent scope should be construed as being included in the concepts.

What is claimed is:

1. A stack package comprising:
   a package substrate;
   a lower stack including lower dies stacked on the package substrate to form a zigzag shape in a vertical direction;
   an upper stack including upper dies that are sequentially offset stacked in an offset direction while providing a first upper side of a down staircase shape, a first end of an uppermost upper die among the upper dies protruding further than a first lower side of the lower stack; and
   a first passive device disposed on the package substrate and spaced apart from the first lower side, and disposed between a first portion of the package substrate and the first upper side.

2. The stack package of claim 1, wherein the first end of the uppermost upper die among the upper dies protrudes, in a horizontal direction, further than the first lower side of the lower stack.

3. The stack package of claim 1, further comprising an encapsulation layer covering the package substrate and encapsulating the lower stack and the upper stack, wherein the first passive device is disposed in a first space between a first outer side of the encapsulation layer and the first lower side, the first upper side, and a first portion of the package substrate.

4. The stack package of claim 3, further comprising a second passive device disposed in a second space between a second outer side of the encapsulation layer opposite to the first outer side, a second lower side of the lower stack, and between a second portion of the package substrate and the upper stack.

5. The stack package of claim 4,
   wherein a lowermost upper die among the upper dies has a second end protruding, in a horizontal direction, further than the second lower side of the lower stack opposite to the first lower side, and
   wherein the second passive device is disposed on the second portion of the package substrate so that an upper end of the second passive device is lower than the second end of the lowermost upper die.

6. The stack package of claim 5, wherein the second passive device is disposed on the second portion of the package substrate so that a portion of the second passive device overlaps the second end of the lowermost upper die.

7. The stack package of claim 1, wherein the first passive device is disposed on the first portion of the package substrate so that an upper end of the first passive device is lower than the first end of the uppermost upper die.

8. The stack package of claim 1, wherein the first passive device is disposed on the first portion of the package substrate so that a portion of the first passive device overlaps the first end of the uppermost upper die.

9. The stack package of claim 1, wherein the first passive device is disposed on the first portion of the package substrate to be spaced apart from the first end of the uppermost upper die.

10. The stack package of claim 1, further comprising a second passive device disposed on the package substrate and spaced apart from a second lower side of the lower stack, the second lower side of the lower stack opposite to the first lower side, and the second passive device is disposed between a second portion of the package substrate and the upper stack.

11. The stack package of claim 10, wherein the second passive device has a thinner thickness than the first passive device.

12. The stack package of claim 10, wherein the first passive device includes a capacitor device, and the second passive device includes a resistor device.

13. The stack package of claim 1, wherein the upper stack further includes a second upper side of an up staircase shape on an opposite side of the first upper side, and
   wherein the up staircase shape exposes upper bonding pads of the upper dies.

14. The stack package of claim 13, further comprising first bonding wires electrically connecting the upper bonding pads to first bonding fingers of the package substrate.

15. The stack package of claim 1, wherein the lower stack includes:
   a first sub stack;
   a second sub stack vertically stacked on the first sub stack; and
   a first adhesive layer bonding the second sub stack to the first sub stack.

16. The stack package of claim 15, wherein the first and second sub stacks have the same shape and are stacked while being aligned in a vertical direction with each other.

17. The stack package of claim 16, wherein the first sub stack includes:
a first lower die including first lower bonding pads; and
a second lower die that is offset stacked on the first lower die in a second offset direction opposite to the first offset direction while exposing the first lower bonding pads and includes second lower bonding pads.

18. The stack package of claim 17, wherein the distances offset by each of the upper dies in the first offset direction are substantially the same as a distance by which the second lower die is offset in the second offset direction with respect to the first lower die.

19. The stack package of claim 18, wherein the first sub stack includes a second adhesive layer bonding the second lower die to the first lower die and having a thinner thickness than the first adhesive layer.

20. The stack package of claim 17, further comprising second bonding wires electrically connecting the second lower bonding pads to the first lower bonding pads and electrically connecting to the second bonding fingers of the package substrate.

21. The stack package of claim 20, wherein a portion of each of the second bonding wires is bonded to the second lower bonding pad while being impregnated with the first adhesive layer.

22. The stack package of claim 21, wherein the second sub stack includes a third lower die positioned so that a portion of the third lower die overlaps the portion of the second bonding wire, impregnated with the first adhesive layer.

23. The stack package of claim 20, wherein the first passive device is disposed between the second bonding fingers of the package substrate.

24. The stack package of claim 1, further comprising:
a controller die disposed between the lower stack and the package substrate; and
a supporter disposed around the controller die and supporting the lower stack.

25. A stack package comprising:
a package substrate;
first and second passive devices disposed on the package substrate to be spaced apart from each other;
a lower stack disposed between the first and second passive devices and including lower dies that are vertically stacked and provide first and second lower sides; and
an upper stack including a lowermost upper die having a second end partially overlapping the second passive device, an intermediate upper die, and an uppermost upper die having a first end partially overlapping the first passive device, the lowermost upper die, the intermediate upper die, and the uppermost upper die being sequentially stacked in a staircase shape.

26. The stack package of claim 25, wherein the second passive device has a thinner thickness than the first passive device.

27. The stack package of claim 25, wherein the lower dies form a zigzag shape in a vertical direction and are stacked alternately so that the first and second lower sides have at least one of jagged sides and staggered sides.

* * * * *